United States Patent [19]

Oguro et al.

[11] Patent Number: 5,693,189

[45] Date of Patent: Dec. 2, 1997

[54] METHOD AND APPARATUS FOR SUPPLY OF LIQUID RAW MATERIAL GAS

[75] Inventors: Kyoji Oguro; Yasushi Kurosawa, both of Gunma-ken, Japan

[73] Assignee: Shin-Etsu Handotai Co., Ltd., Tokyo, Japan

[21] Appl. No.: 508,561

[22] Filed: Jul. 28, 1995

[30] Foreign Application Priority Data

Aug. 5, 1994 [JP] Japan ................... 6-204488

[51] Int. Cl.⁶ ............................................. B01D 3/42
[52] U.S. Cl. ........................... 203/3; 261/130; 261/28
[58] Field of Search ..................... 203/3; 261/1, 128, 261/129, 130, 131, 135, 136, 28

[56] References Cited

U.S. PATENT DOCUMENTS

| | | | |
|---|---|---|---|
| 3,095,463 | 6/1963 | Chang et al. | 261/131 |
| 3,901,182 | 8/1975 | Chiang | 118/49 |
| 4,276,243 | 6/1981 | Partus | 261/128 |
| 4,393,013 | 7/1983 | McMenamin | 261/64 B |
| 4,582,480 | 4/1986 | Lynch et al. | 432/1 |
| 5,520,858 | 5/1996 | Yamaguchi et al. | 261/130 |

OTHER PUBLICATIONS

Patent Abstracts of Japan No. JP A 04341340 Nov. 27, 1992.
Patent Abstract of Japan No. JPA 04243535 Aug. 31, 1992.

*Primary Examiner*—Christopher Kim
*Attorney, Agent, or Firm*—Ronald R. Snider

[57] ABSTRACT

The mixed gas of a liquid raw material is stably supplied to not only one reactor but also a plurality of reactors as maintained with high purity at a fixed concentration. A method to supply a liquid raw material gas by the steps of storing a liquid raw material 31 in a bubbling tank 13 with maintaining the stored liquid raw material at a controlled temperature, bubbling a carrier gas 41 through the liquid raw material 31 thereby evaporating the liquid raw material and simultaneously generating a mixed gas composed of the carrier gas 41 and the liquid raw material 31, subjecting the mixed gas to a condensation treatment, and returning the liquefied liquid raw material 31 to the bubbling tank 13 and meanwhile supplying the mixed gas escaped from the liquefaction to a reactor(s), which method is characterized in that the condensation treatment of the mixed gas is carried out with the pressure and temperature thereof controlled at fixed levels, thereby the concentration of the mixed gas supplied to a reactor(s) is kept at a fixed level.

11 Claims, 3 Drawing Sheets

5,693,189

METHOD AND APPARATUS FOR SUPPLY OF LIQUID RAW MATERIAL GAS

BACKGROUND OF THE INVENTION

1. Field of the Invention

This invention relates to a method and an apparatus for the supply of a liquid raw material gas, and more particularly, to a method and an apparatus for an operation comprising the steps of bubbling a carrier gas through a liquid raw material thereby generating a mixed gas composed of the carrier gas and the raw material and supplying the mixed gas to a reactor such as a semiconductor chemical vapor deposition reactor.

2. Description of the Prior Art

Heretofore, such a raw material as germanium tetrachloride ($GeCl_4$), silicon tetrachloride ($SiCl_4$), and trichlorosilane ($SiHCl_3$) have been used for a chemical vapor deposition of a semiconductor and a production of a synthetic quartz. The apparatus for supply of a liquid raw material gas, namely a mixed gas composed of a carrier gas and such a liquid raw material as mentioned above which is generated by bubbling the carrier gas through the liquid material, has been well known in the art.

In the prior art (JP-A-60-248,228; hereinafter referred to as "first prior art") depicted in FIG. 3, for example, a liquid raw material 201 which is in a liquid state at room temperature is stored in a bubbler tank 203 provided with a heater 202 and a carrier gas 204 controlled in motion at a flow volume by a flow meter 205 is bubbled through the liquid raw material 201 meanwhile being kept heated with the heater 202 to generate a mixed gas 206 composed of the carrier gas 204 and the liquid raw material 201. The mixed gas 206 is passed through a condenser 207 kept at a fixed temperature so that part thereof may be liquefied and supplied to a reactor in the form of saturated vapor.

A technique, similar to the first prior art, which detects a temperature and a storages mount of the liquid raw material 201, an amount of the bubbling carrier gas 204, and a temperature of the condenser 207 and, based on the outcomes of the detection, controls the supply of the liquid raw material 201, the flow volume of the carrier gas 204, and the temperature of the condenser (JP-A-61-257,232; hereinafter referred to as "second prior art") has been also known to the art.

The apparatus, as the first or the second prior art mentioned above, which is designed to supply the mixed gas 206 of the liquid raw material 201 and the carrier gas 204 at a certain flow volume as taught operates effectively so long as the apparatus is used for supplying the liquid raw material gas exclusively for one reactor.

When one apparatus of the first or the second prior art mentioned above is operated to supply the liquid raw material gas simultaneously at a certain flow volume for a plurality of reactors, however, the pressure of the mixed gas 206 in the apparatus, specifically in the condenser 207, is varied by the total amount of the carrier gas 204 to be supplied or by the number of reaction devices to be involved. As a result, the concentration of the liquid raw material 201 in the mixed gas 206 which is once in a saturated state in the condenser 207 is proportionately varied and the growth rates in the reactors are consequently varied.

If the concentration of the liquid raw material 201 in the mixed gas 206 is to be controlled by the controlling the temperature of the condenser 207 as contemplated by the second prior art, it is necessary that a new temperature should be set for the condenser 207 whenever the flow volume of the liquid raw material gas to be supplied to the reactors is changed. The control of temperature, however, cannot be effected with high accuracy because the condenser 207 consumes a length of time in heightening or lowering the temperature thereof to the newly set level and never fails to involve a delay in cooling the mixed gas 206.

There has also existed the problem that minute amounts of heavy metals exuding from containers and pipes during the process of synthesis and during the process of transfer and storage are accumulated in the liquid raw material 201 and they are conveyed together with the mixed gas 206 into the reactors.

This invention, produced in view of the true state of prior art mentioned above, has for an object thereof the provision of a method and an apparatus which are capable of maintaining a mixed gas composed of a liquid raw material and a carrier gas with high purity at a fixed concentration and supplying this mixed gas stably to not only one reactor but also a plurality of reactors.

SUMMARY OF THE INVENTION

A method to supply a raw material gas for epitaxial growth according to the first aspect of the invention is a method to supply a liquid raw material gas by the steps of storing a liquid raw material in a bubbling tank with keeping the stored liquid raw material at a controlled temperature, bubbling a carrier gas through the liquid raw material thereby evaporating the liquid raw material and simultaneously generating mixed gas composed of the carrier gas and the liquid raw material, subjecting the mixed gas to a condensation treatment and returning the liquefied liquid raw material to the bubbling tank and meanwhile supplying the mixed gas escaped from liquefaction to a reactor(s), characterized in that the condensation treatment of the mixed gas is carried out with the pressure and temperature thereof controlled at fixed levels, thereby the concentration of the mixed gas supplied to a reactor(s) is kept at a fixed level.

Advantageously, the condensation treatment of the mixed gas is carried out with the pressure and temperature thereof controlled at fixed levels by causing the pressure for the condensation treatment of the mixed gas to be fed back to the operating part for the pressure control means of the carrier gas thereby controlling the amount of the carrier gas supplied for the purpose of bubbling and, at the same time, causing the temperature for the condensation treatment of the mixed gas to be at a fixed level in the cooling part of the means for the condensation treatment.

It is desirable that the liquid raw material stored in the bubbling tank is maintained at a fixed temperature so that part of the mixed gas emanating from the bubbling tank and being subjected to the condensation treatment is liquefied without fail. Further, it is desirable that the pressure in the condensation treatment of the mixed gas is controlled at a fixed level of absolute pressure.

An apparatus to supply a raw material gas for epitaxial growth according to the second aspect of the invention is an apparatus to supply a liquid raw material gas adapted to store a liquid raw material in a bubbling tank and bubble a carrier gas through the liquid raw material so as to evaporate the liquid raw material and meanwhile generate a mixed gas composed of the carrier gas and the liquid raw material, comprising a controlling means for controlling the amount of the carrier gas to be supplied at a piping system used for supplying the carrier gas for bubbling, a heating means for keeping the liquid raw material stored in the bubbling tank at a fixed temperature, a column for rectifying disposed in the upper part of the bubbling tank as integrated with the bubbling tank and made to communicate with the means for the condensation treatment through the medium of piping, and the means for the treatment to condense the mixed gas with the pressure and temperature thereof controlled at fixed levels thereby the concentration of the mixed gas supplied to a reactor(s) is maintained at a fixed level, wherein a part of the mixed gas generated in the bubbling tank is condensed by cooling to a fixed temperature and refluxed to the rectifying column and the mixed gas escaped from liquefaction is detected the pressure whose outcome is fed back to the means for controlling the amount of the carrier gas.

It is desirable that the pressure in the condensation treatment of the mixed gas is controlled at a fixed level of absolute pressure.

The cooling part in the means for the condensation treatment desirably possesses a enough heat transfer area so that the mixed gas escaped from liquefaction and flowing out of the means for the condensation treatment is cooled to a temperature practically the same as that of the cooling part.

It is desirable that the means for the condensation treatment effects the condensation by cooling the mixed gas with a first cooling medium, and the means for supplying the first cooling medium is desirably composed of a heat exchanger, a cooling medium circulating apparatus for circulating the first cooling medium between the cooling part of the means for the condensation treatment and the heat exchanger thereby keeping the cooling medium at a fixed temperature, and a cooling apparatus for controlling the temperature of a second cooling medium for cooling the first cooling medium to a fixed temperature through the medium of the heat exchanger.

It is desirable that the heating means for keeping the liquid raw material stored in the bubbling tank at a controlled temperature is a jacket communicating therewith a heating medium supply device capable of controlling the temperature and flow volume of a heating medium.

It is also desirable that the amount of the liquid raw material in storage is controlled by using a storage amount detecting means disposed in the bubbling tank and the amount of the liquid raw material equivalent to the shortage determined by the detection is supplied from a storage tank for the liquid raw material to the bubbling tank.

The bubbling tank desirably is provided with a draining pipe incorporated with a switching valve. Pressure fructuation of the mixed gas supplied to a reactor(s) may be restrained by the use of a buffer tank.

What is important in the supply of a liquid raw material gas to such a reactor(s) as a chemical vapor deposition reactor (CVD reactor) of a semiconductor by the use of an apparatus (so-called a bubbling tank) which generates a mixed gas composed of a liquid raw material and a carrier gas by bubbling the carrier gas through the liquid raw material is the fact that the liquid raw material gas of high purity should be supplied stably.

The difference between the supply of the liquid raw material gas by the use of the bubbling tank to a plurality of reactors and the same supply to only one reactor resides in the fact that the pressure of the mixed gas in the bubbling tank, specifically in the condenser, varies with the total amount of the carrier gas to be supplied and the number of reactors to be involved.

When the pressure of the mixed gas varies in the condenser which determines the concentration of the liquid raw material gas existing in the form of vapor in the mixed gas, the concentration of the liquid raw material in the mixed gas is inevitably varied in consequence of the condensation treatment in spite of the constant maintenance of the mixed gas in the saturated state because the gas supersaturated by the variation of pressure is suffered to liquefy partly. As a result, the growth rate in the reactor using the mixed gas is varied.

Accordingly, what is important in the supply of the liquid raw material gas to a plurality of reactors by the use of the bubbling tank mentioned above is the fact that the liquid raw material gas of high purity should be supplied stably at a fixed concentration.

First, for the purpose of maintaining the concentration of the liquid raw material at a constant level in the mixed gas supplied to the reactors, it is important that the pressure and temperature of the mixed gas is maintained at fixed levels while the condensation treatment is undergoing in the condenser. If the pressure and temperature of the mixed gas are not fixed, the concentration of the liquid raw material gas in the mixed gas maintained in the saturated state will fluctuate even when the flow volume of the mixed gas is fixed.

The mixed gas which has undergone the condensation treatment in the condenser of the bubbling tank is passed through the supply piping, the reactors, and the exhaust gas piping and discharged into the open air. Specifically, since the apparatus to supply the liquid raw material gas communicates with the open air, a change of the atmospheric pressure exerts a due effect on the pressure in the condenser. For the purpose of maintaining the constant concentration of the mixed gas in the condenser, therefore, it is desirable that the pressure inside the condenser is controlled in absolute pressure.

For the purpose of maintaining the constant concentration of the mixed gas in the condenser, it is further necessary that the mixed gas in the condenser is constantly maintained in the saturated state. The condenser is an apparatus for maintaining the mixed gas at a fixed concentration by subjecting the mixed gas to the treatment for condensation thereby causing it to assume a saturated state and liquefying the excess gas and expelling the produced liquid. The condensate is refluxed to the bubbling tank.

If an increase in the flow volume of the carrier gas for bubbling results in lowering the temperature of the liquid raw material in the bubbling tank by the latent heat of gasification and consequently lowering the concentration of the liquid raw material in the mixed gas supplied from the bubbling tank to the condenser to a point where the mixed gas in the condenser is no longer liquefied by the condensation treatment, the condenser will be no longer capable of maintaining the constant concentration of the mixed gas therein.

For the purpose of maintaining the mixed gas in the condenser constantly in the saturated state, it is only necessary that when the mixed gas flowing out of the bubbling tank is subjected to the condensation treatment, the mixed gas is enabled to be partly liquefied without fail by having the liquid raw material stored in the bubbling tank maintained at a controlled temperature fairly higher than the temperature of the condenser.

Then, for the purpose of ensuring supply of the raw material gas of high purity, it is necessary that the minute amounts of heavy metals which have emanated from containers, pipes, etc. and accumulated in the liquid raw material during the process of synthesis and the process of conveyance and storage should be removed. Therefore, the bubbling tank is provided in the upper part thereof with a rectifying column adapted to rectify the mixed gas and in the lower part thereof with a drain pipe to remove the heavy metals accumulated in the liquid raw material.

The mixed gas, on entering the rectifying column, contacts with the condensate of low temperature formed by liquefaction in the condenser and refluxed to the rectifying column and the part thereof liquefies and meanwhile gasifies again the refluxed condensate and incorporates the resultant gas into the mixed gas. When the rectifying column is filled with a packing prepared by cutting slender pipes, the rectification which simultaneously implements liquefaction and gasification is enabled to proceed efficiently because the packing adds the area of contact between the mixed gas and the refluxed condensate.

While this rectification is repeated, the vapor generated in the rectifying column gains more in its content of the low boiling component in accordance as the height of the interior of the rectifying column increases. The mixed gas, therefore, is transferred to the condenser from the uppermost part of the rectifying column in which the mixed gas has the highest purity.

Since the heavy metals and high boiling impurities are returned in conjunction with the condensate generated by liquefaction in the rectifying column into the bubbling tank, the concentrations of these heavy metals and high boiling impurities accumulated in the liquid raw material in the bubbling tank are gradually heightened. The liquid raw material, therefore, should be properly discharged from the bubbling tank into an extraction tank via the drain pipe provided in the bottom of the bubbling tank.

For the purpose of ensuring stable supply of the mixed gas, it is necessary that the liquid raw material and the carrier gas are stably supplied in the bubbling tank. Particularly, the carrier gas is so controlled as to maintain the mixed gas within the condenser under a fixed pressure constantly as described above. The liquid raw material in the bubbling tank can be controlled by a procedure which comprises detecting the amount of the liquid raw material stored therein and supplying from the storage tank of the liquid raw material such an amount of the liquid raw material equivalent to the shortage determined by the detection.

BRIEF DESCRIPTION OF THE DRAWINGS

The invention will be better understood and objects, features, and characteristics thereof other than those set forth above will become apparent when consideration is given to the following detailed description thereof. Such description makes reference to the annexed drawings wherein.

DETAILED DESCRIPTION OF THE PREFERRED EMBODIMENT

Now, the construction and operation of this invention will be described more specifically below with reference to the embodiment shown in the annexed drawings.

Figure 1:
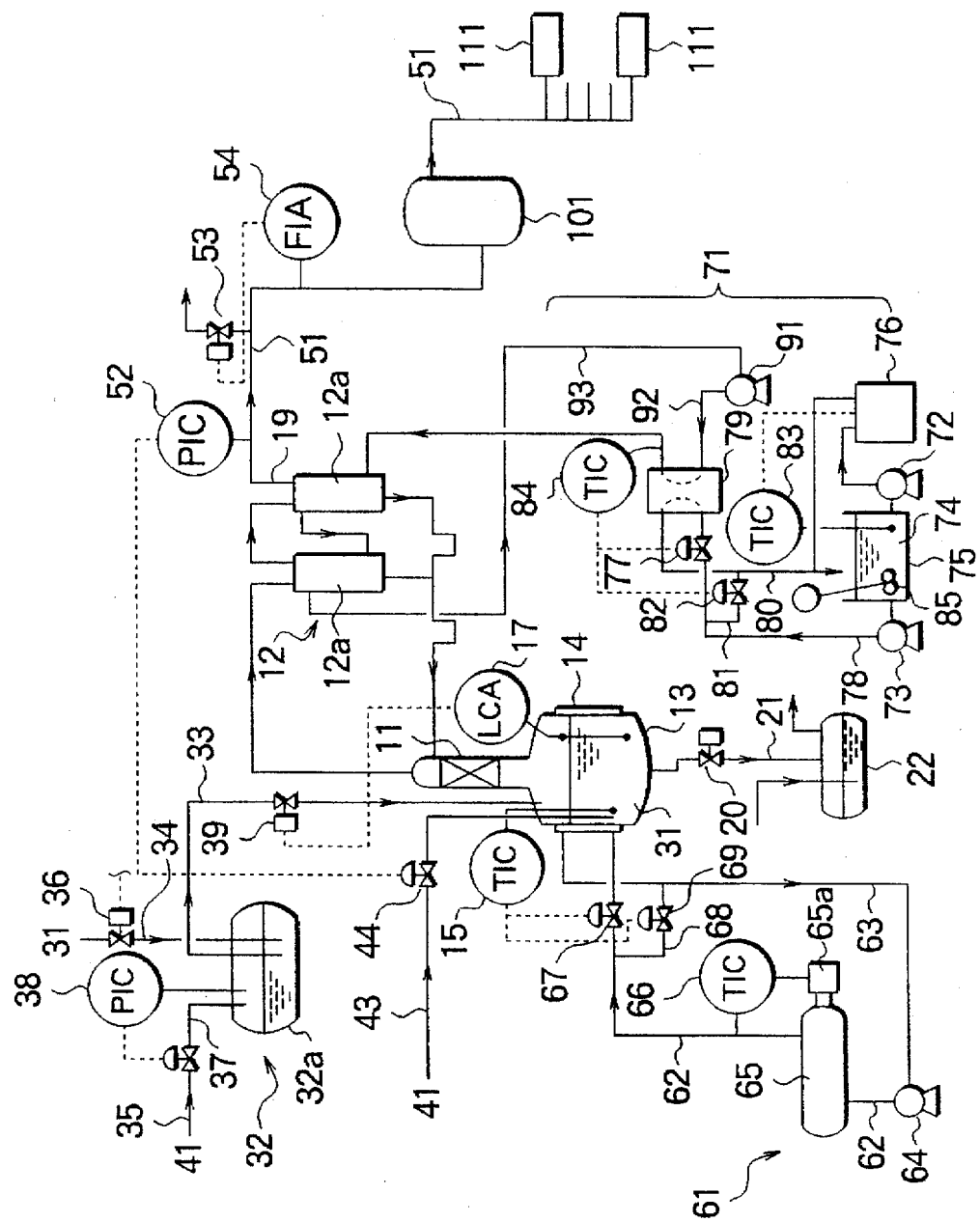
FIG. 1 is a process flow sheet showing an embodiment of this invention.
Figure 2:
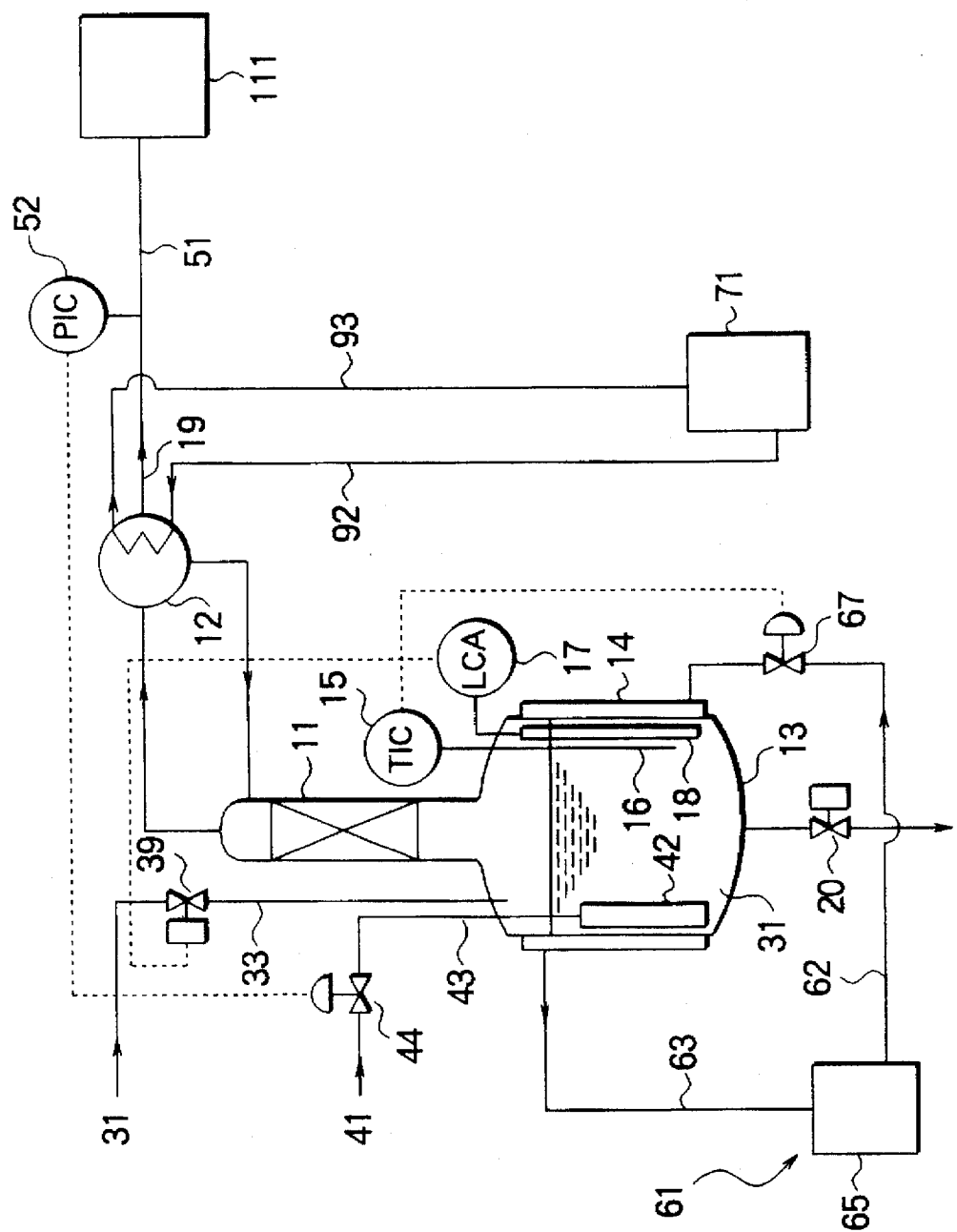
FIG. 2 is a process flow sheet showing the essential part of the embodiment of FIG. 1.
Figure 3:
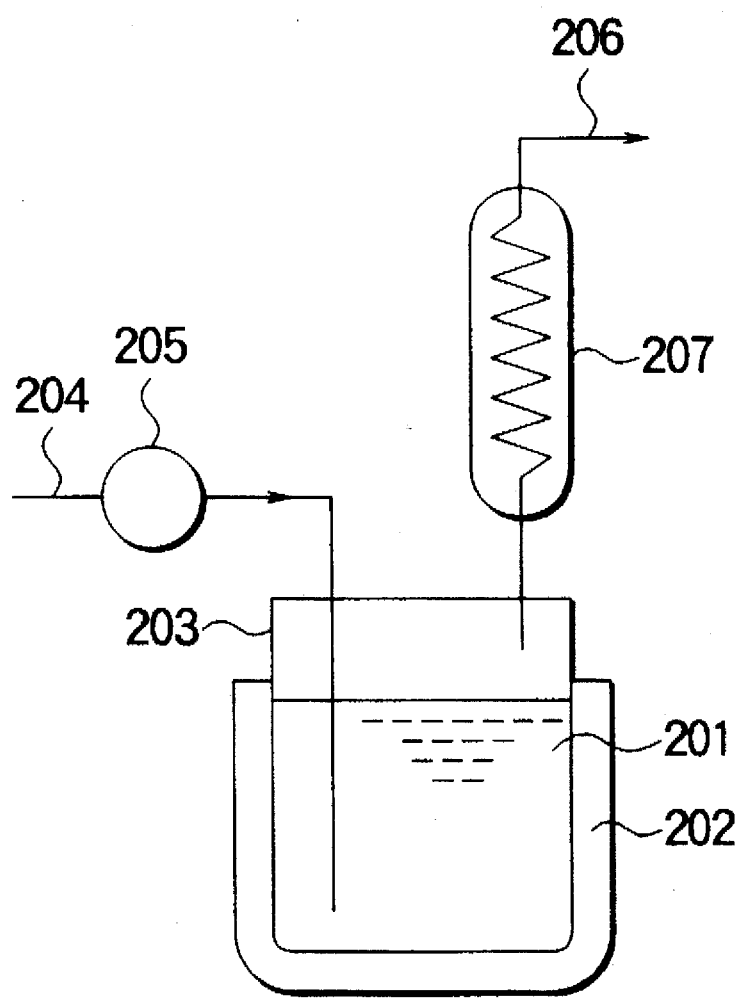
FIG. 3 is a schematic diagram showing a conventional apparatus to supply a raw material mixed gas.

FIG. 1 is a process flow sheet showing the whole construction of an apparatus to supply a liquid raw material gas and FIG. 2 is an explanatory diagram showing the essential part of the apparatus of FIG. 1. This apparatus is so constructed as to prepare a mixed gas of a carrier gas and a vapor of a liquid raw material deprived of such impurities as heavy metals by bubbling the carrier gas 41 through a liquid raw material 31 (for example, silicon tetrachloride, trichlorosilane) held inside a bubbling tank 13 and meanwhile rectifying the vapor resulted from the bubbling within a continuous type packed column 11 for rectifying (hereinafter referred to as "packed column") disposed in the upper part of the bubbling tank 13 and integrated with the bubbling tank 13 and, at the same time, control the concentration of the mixed gas being supplied to a reactor at a fixed level by maintaining the absolute pressure and temperature of the mixed gas at fixed levels and meanwhile subjecting the mixed gas to a condensation treatment with a partial condenser 12 which is one sort of a condenser.

Around the bubbling tank 13, a heating jacket 14 adapted to maintain the liquid raw material 31 at a controlled temperature is disposed so as to encircle the bubbling tank 13. Into the heating jacket 14, a liquid heating medium kept at the controlled temperature is supplied from a heating medium supplying apparatus 61 through a piping 62.

In the heating medium supply apparatus 61, a circulating pump 64, a heater 65 provided with an electric heater 65a and concurrently serving as a storage tank for the liquid heating medium, and the heating jacket 14 are caused to communicate with one another through pipings 62 and 63. The piping 62 is provided with a temperature indication controller (TIC) 66 whose controlling part is connected to the operating part of the electric heater 65a so as to control the temperature of the liquid heating medium and consequently maintain the liquid raw material 31 in the bubbling tank 13 at the controlled temperature.

Further, the piping 62 is provided with a regulating valve 67 and a shortpath piping 68 interconnecting the pipings 62 and 63 is provided with a regulating valve 69 and the regulating part of a temperature indication controller (TIC) 15 inserted in the bubbling tank 13 is connected to the operating parts of the regulating valves 67 and 69 so as to control the flow volume of the liquid heating medium flowing into the heating jacket 14 and consequently maintain the liquid raw material 31 in the bubbling tank 13 at a controlled temperature.

To start the heating of the bubbling tank 13, the temperature of the temperature indication controller 15 is set at 40° C. and the regulating valve 67 is closed and the regulating valve 69 is opened. In the heating medium supply apparatus 61, the heating medium circulated in the heating medium supply apparatus 61 is heated and the temperature of the heating medium is stabilized at the controlled temperature by starting the circulating pump 64, setting the temperature of the temperature indication controller 66 at 80° C., and starting the electric heater 65a.

A bubbling member 42 for the carrier gas 41 is immersed in the liquid raw material 31 held in the bubbling tank 13. From the source (not shown) of the carrier gas 41, the carrier gas 41 is introduced via a carrier gas supplying piping 43 provided with an absolute pressure regulating valve 44 into the liquid raw material 31 and bubbled therethrough to generate a mixed gas composed of the gasified liquid raw material and the carrier gas.

The mixed gas generated in the bubbling tank 13 is rectified in the packed column disposed in the upper part of the bubbling tank 13 so as to deprive the mixed gas of heavy metals and impurities with high boiling points.

The top of the packed column is caused to communicate with the partial condenser 12 via a piping so that the mixed gas is transferred to the partial condenser 12 and part of the mixed gas cooled in the partial condenser 12 may be liquefied and refluxed to the packed column 11. The refluxed liquid, while flowing down the surface of the packing (cut pieces of slender pipes) in the packed column 11, contacts with the mixed gas originating in the bubbling tank 13 and ascending the interior of the packed column 11 and gasifies part of itself and meanwhile liquefies part of the mixed gas. As the rectification which simultaneously implements liquefaction and gasification in the packed column 11 is repeated, the vapor generated in the packed column gains more in its content of the low boiling component in accordance as the height of the interior of the packed column increases. The mixed gas, therefore, is transferred to the partial condenser 12 from the uppermost part of the packed column in which the mixed gas has the highest purity.

Optionally, the packed column 11 may be substituted by a column of such other construction for rectifying as the sieve tray column or the bubble cap-tower. A batchwise column may be adopted alternatively.

Since the heavy metals and impurities with high boiling points are returned in conjunction with the condensate resulting from the liquefaction in the packed column 11 to the bubbling tank 13, the concentrations of the heavy metals and impurities with high boiling points accumulated in the liquid raw material inside the bubbling tank 13 are gradually heightened. When the concentrations of the impurities inside the bubbling tank 13 are heightened, these impurities eventually begin to entrain the mixed gas which flows out of a mixed gas outlet 19. So, the purity of the liquid raw material 31 inside the bubbling tank 13 is properly tested from time to time. When the concentrations of the impurities are found by this test to have reached to critical levels, a certain amount of the liquid raw material 31 is extracted into an extracting tank 22 via a drain pipe 21 provided in the bottom part of the bubbling tank 13. In this manner, the concentrations of impurities of the liquid raw material 31 in the bubbling tank 13 are controlled below the critical levels.

The partial condenser 12 which communicates with the top of the packed column 11 through the medium of a piping is provided with a surface condenser 12a having a heat transfer area enough to cool the mixed gas. By cooling the mixed gas composed of the carrier gas and the vapor of the liquid raw material 31 distilled out of the packed column 11 to a fixed temperature and consequently liquefying part of the mixed gas, the partial condenser 12 returns the liquefied mixed gas to the packed column 11 in the form of a reflux liquid and, at the same time, controls pressure of the mixed gas which has escaped from liquefaction to fixed absolute pressure and temperature to ensure the supply of the raw material gas with a fixed concentration to a reactor(s).

The mixed gas outlet 19 of the partial condenser 12 is provided with a pressure indication controller (PIC) 52 and is consequently enabled to detect the absolute pressure of the mixed gas practically in the partial condenser 12. The pressure indication controller is further connected to the operating part of a regulating valve 44 provided in a carrier gas supply piping 43 and consequently enabled to adjust the degree of opening of the regulating valve 44 for controlling the absolute pressure of the mixed gas in the partial condenser 12.

The partial condenser 12, by having a cooling water supply apparatus 71 connected through the medium of pipings 92 and 93 to the cooling parts of the plurality of serially disposed surface condensers 12a, is enabled to maintain the temperature of the mixed gas distilling out of the partial condenser 12 at a fixed level constantly.

The cooling water supply apparatus 71 mentioned above is an apparatus for supplying the cooling water of a fixed temperature to the partial condenser 12. It is composed of a heat exchanger 79, a cooling medium circulating apparatus for circulating the cooling water between the cooling parts of the surface condensers 12a and the heat exchanger 79 to cool the cooling parts mentioned above to a fixed temperature, and a cooling apparatus for cooling the cooling water being circulated in the cooling medium circulating apparatus to a fixed temperature through the medium of the heat exchanger 79.

In the cooling apparatus, the suction side of a circulating pump 72 is connected to a storage tank 75 of a cooling water 74, the discharge side of the circulating pump 72 is connected to a refrigerating device 76, and the output of the cooling water 74 from the refrigerating apparatus 76 is connected to the storage tank 75. The storage tank 75 is provided with a temperature indication controller (TIC) 83 and the controlling part of the above controller 83 is connected to the driving part (not shown) of the refrigerating apparatus 76 to control the temperature of the cooling water 74 at a fixed level. The suction side of a circulating pump 73 is connected to the storage tank 75 of the cooling water 74, the discharge side of the circulating pump 73 is connected to the heat exchanger 79 through the medium of a piping 78 provided with a regulating valve 77, and the outlet of the cooling water 74 from the heat exchanger 79 is connected to the storage tank 75 through the medium of a piping 80. A shortpath piping 81 interconnecting the pipings 78 and 80 is provided with a regulating valve 82. This value 82 is enabled to control the flow volume of the cooling water 74 supplied to the heat exchanger 79. Further, the storage tank 75 is provided with a stirrer 85 and consequently enabled to stabilize the temperature of the cooling water in the storage tank 75 at a fixed level.

The cooling medium circulating apparatus mentioned above is provided with a circulating pump 91. A piping 92 on the discharge side of the circulating pump 91 is made to communicate with the cooling parts of the surface condensers 12a through the medium of the heat exchanger 79 and the cooling water outlet sides of the cooling parts are made to communicate with the suction side of the circulating pump 91 through the medium of a piping 93. The piping 92 mentioned above is provided with a temperature indication controller (TIC) 84. The controlling part of the controller 84 is made to communicate with the operating parts of the regulating valves 77 and 82 to control the flow volume of the cooling water 74 supplied to the heat exchanger 79.

In the cooling water supply apparatus 71, the refrigerating apparatus 76 is set in a stationary operating state, the controller 84 of the cooling medium circulating apparatus is set at a temperature of 12° C., and the controller 83 of the cooling apparatus is set at a temperature of 11° C. Since the temperature of the cooling water is doubly controlled with the controllers 83 and 84 as described above, the temperature of the cooling water supplied to the partial condenser 12 can be controlled accurately within the range of "set level±0.2° C."

For the sake of stable supply of the mixed gas, it is necessary that the liquid raw material 31 is secured stably in the bubbling tank 13. A supplying apparatus 32 for supplying the liquid raw material 31 to the bubbling tank 13 is complete with a storage tank 32a for storing the liquid raw material 31 under the pressure of the carrier gas 41.

Specifically, the end part of a liquid raw material supplying pipe 33 is immersed in the liquid raw material 31 held in the storage tank 32a and a liquid raw material inlet pipe 34 and a supplying pipe 35 for the pressed carrier gas 41 are made to communicate with the upper part of the storage tank 32a. The liquid raw material inlet pipe 34 is provided with a solenoid valve 36 and the pressed carrier gas supplying pipe 35 is provided with a regulating valve 37. The storage tank 32a is provided in the upper part thereof with a pressure indication controller (PIC) 38, the regulating part of the above controller 38 is made to communicate with the operating part of the regulating valve 37, the storage tank 32a is provided with a level controller alarm (not shown), and the regulating part of the above level controller alarm is made to communicate with the operating part of the solenoid valve 36 mentioned above. Further, the liquid raw material supplying pipe 33 is provided with a solenoid valve 39 and the regulating part of a level controller alarm 17 is made to communicate with the operating part of the solenoid valve 39.

In FIG. 2, part 16 stands for a temperature detecting part and part 18 for a level detecting part.

To actuate the supplying apparatus 32, it is necessary that the level controller alarm is actuated to open the solenoid valve 36 and a desired amount of trichlorosilane (boiling point 31.7° C. under normal pressure) is injected as a liquid raw material 31 into the storage tank 32a. Then, the pressure indication controller 38 is actuated to open the regulating valve 37 and the pressed carrier gas 41 is supplied to the storage tank 32a to maintain the interior of the storage tank under a certain pressure.

When the height of the liquid raw material 31 inside the bubbling tank 13 has fallen to a specified level, the level controller alarm (LCA) 17 is actuated to open the solenoid 39 and, by virtue of the pressure of the carrier gas 41 in the storage tank 32a, the liquid raw material 31 in the storage tank is supplied in a desired amount into the bubbling tank 13 through the medium of the liquid raw material supplying pipe 33.

The mixed gas which flows out of the partial condenser 12 is advanced via a raw material gas supplying pipe 51 to a buffer tank 101 for further repression of the fluctuation of pressure and then supplied to a plurality of parallelly disposed reactors 111, 111, ... through the medium of the raw material gas supplying pipe 51.

When none of the reactors 111 is in operation, a flow indicator alarm (FIA) 54 detects the absence of the flow of the mixed gas, and the regulating part of the flow indicator alarm 54 is made to communicate with the operating part of a solenoid valve 53 provided in a purge line and open the solenoid valve 53. Consequently, the mixed gas is made to flow in the purge line.

It is clear from the description given above that this invention allows the mixed gas of a liquid raw material to be maintained with high purity at a fixed concentration and stably supplied not only to one reactor but also to a plurality of reactors.

What is claimed is:

1. An apparatus to supply a liquid raw material gas adapted to store a liquid raw material in a bubbling tank and bubble a carrier gas through the liquid raw material so as to evaporate the liquid raw material and meanwhile generate a mixed gas composed of the carrier gas and the liquid raw material, comprising a controlling means for controlling the amount of the carrier gas to be supplied at a piping system used for supplying the carrier gas for bubbling, a heating means for keeping the liquid raw material stored in the bubbling tank at a fixed temperature, a rectifying column disposed in the upper part of the bubbling tank as integrated with the bubbling tank and made to communicate with the means for the condensation treatment through the medium of piping, and the means for the treatment to condense the mixed gas with the pressure and temperature thereof controlled at fixed level is thereby the concentration of the mixed gas supplied to a reactor(s) is maintained a fixed level, wherein a part of the mixed gas generated in the bubbling tank is condensed by cooling to a fixed temperature and refluxed to the rectifying column and the mixed gas escaped from liquefaction is detected the pressure whose outcome is fed back to the means for controlling the amount of the carrier gas.

2. The apparatus according to claim 1, wherein the pressure in the condensation treatment of the mixed gas is controlled at a fixed level of absolute pressure.

3. The apparatus according to claim 1, wherein a cooling part in the means for the condensation treatment possesses enough heat transfer area so that the mixed gas escaped from liquefaction and flowing out of the means for the condensation treatment is cooled to a temperature approaching that of the cooling part.

4. The apparatus according to claim 1, wherein said means for the condensation treatment effects the condensation by cooling said mixed gas with a first cooling medium and a means for supplying said first cooling medium comprises a heat exchanger, a cooling medium circulating apparatus for maintaining said first cooling medium at a fixed temperature by circulating said first cooling medium between the cooling part of said means for the condensation treatment and said heat exchanger, and a cooling apparatus for controlling the temperature of a second cooling medium for cooling said first cooling medium to a fixed temperature through the medium of said heat exchanger.

5. The apparatus according to claim 1, wherein jacket is used as heating means for maintaining said liquid raw material stored in said bubbling tank at a controlled temperature and a heating medium supplying apparatus capable of controlling the temperature and flow volume of said heating medium is made to communicate with said jacket.

6. The apparatus according to claim 1, wherein the amount of said liquid raw material in storage is controlled by a means for detecting the amount of said liquid raw material in storage with a storage amount detecting means disposed inside said bubbling tank and means for supplying from a storage tank for said liquid raw material to said bubbling tank an amount of said liquid raw material equivalent to the shortage found by said detection.

7. The apparatus according to claim 1, wherein said bubbling tank is provided with a drain pipe incorporating a switch valve therein.

8. The apparatus according to claim 1, wherein possible fluctuation of the pressure of said mixed gas to be supplied to said reactor is controlled by a buffer tank.

9. A method for supplying a liquid raw material gas comprising the steps of:

storing a liquid raw material in a bubbling tank with maintaining said stored liquid raw material at a controlled temperature;

bubbling a carrier gas through said liquid raw material thereby evaporating said liquid raw material and simultaneously generating a mixed gas composed of said carrier gas and said liquid raw material;

subjecting said mixed gas to a condensation treatment, returning the liquefied raw material to said bubbling tank meanwhile supplying the mixed gas escaped from liquefaction to a reactor(s);

wherein the condensation treatment of the mixed gas is carried out with the pressure and temperature thereof controlled at fixed levels by causing the pressure for the condensation treatment of the mixed gas to be fed back to a pressure control means for the carrier gas thereby controlling the amount of the carrier gas supplied for the purpose of bubbling and, at the same time, causing the temperature for the condensation treatment of the mixed gas to be at a fixed level in the cooling part of the means for the condensation treatment; and resulting that the concentration of said mixed gas supplied to a reactor(s) is kept at a fixed level.

10. The method according to claim 9, wherein said liquid raw material stored in the bubbling tank is maintained at a fixed temperature so that part of the mixed gas emanating from the bubbling tank and being subjected to the condensation treatment is liquefied without fail.

11. The method according to claim 9, wherein the pressure for said condensation treatment of said mixed gas is controlled at a fixed level of absolute pressure.

* * * * *